United States Patent
Lin et al.

(10) Patent No.: US 11,635,462 B2
(45) Date of Patent: Apr. 25, 2023

(54) LIBRARY CELL MODELING FOR TRANSISTOR-LEVEL TEST PATTERN GENERATION

(71) Applicant: Mentor Graphics Corporation, Wilsonville, OR (US)

(72) Inventors: Xijiang Lin, West Linn, OR (US); Wu-Tung Cheng, Lake Oswego, OR (US); Takeo Kobayashi, Beaverton, OR (US); Andreas Glowatz, Heidenau (DE)

(73) Assignee: Siemens Industry Software Inc., Plano, TX (US)

( * ) Notice: Subject to any disclaimer, the term of this patent is extended or adjusted under 35 U.S.C. 154(b) by 208 days.

(21) Appl. No.: 17/004,288

(22) Filed: Aug. 27, 2020

(65) Prior Publication Data

US 2022/0065929 A1 Mar. 3, 2022

(51) Int. Cl.
*G01R 31/00* (2006.01)
*G01R 31/317* (2006.01)
*G01R 31/3177* (2006.01)

(52) U.S. Cl.
CPC ........ *G01R 31/31724* (2013.01); *G01R 31/3177* (2013.01)

(58) Field of Classification Search
None
See application file for complete search history.

(56) References Cited

U.S. PATENT DOCUMENTS

| 8,875,077 | B1* | 10/2014 | O'Riordan | G06F 30/367 716/112 |
| 10,657,207 | B1* | 5/2020 | Tang | G06F 30/333 |
| 2009/0019408 | A1* | 1/2009 | Saito | G05B 19/41875 716/106 |
| 2010/0229061 | A1* | 9/2010 | Hapke | G01R 31/318342 714/740 |
| 2013/0054161 | A1* | 2/2013 | Hapke | G06F 30/367 702/58 |

(Continued)

OTHER PUBLICATIONS

P.-Y. Chuang, C.-W. Wu and H. H. Chen, "Cell-aware test generation time reduction by using switch-level ATPG," 2017 International Test Conference in Asia (ITC-Asia), 2017, pp. 27-32, doi: 10.1109/ITC-ASIA.2017.8097105. (Year: 2017).*

(Continued)

*Primary Examiner* — Daniel F. McMahon

(57) ABSTRACT

This application discloses a computing system implementing an automatic test pattern generation tool to convert a transistor-level model of a library cell describing a digital circuit into a switch-level model of the library cell, generate test patterns configured to enable detection of target defects injected into the switch-level model of the library cell, and bifurcate the test patterns into a first subset of the test patterns and a second set of the test patterns based on detection types for the target defects enabled by the test patterns. The computing system can implement a cell model generation tool to perform an analog simulation of the transistor-level model of the library cell using the second subset of the test patterns to verify that they enable detection of target defects, while skipping performance of the analog simulation of the transistor-level model of the library cell using the first subset of the test patterns.

17 Claims, 7 Drawing Sheets

(56) References Cited

U.S. PATENT DOCUMENTS

| | | | |
|---|---|---|---|
| 2015/0234978 A1* | 8/2015 | Tang | G06F 11/261 716/112 |
| 2018/0060472 A1* | 3/2018 | Chen | G01R 31/318342 |
| 2020/0279064 A1* | 9/2020 | Boutobza | G06F 30/337 |
| 2020/0410065 A1* | 12/2020 | Cheng | G06F 30/30 |
| 2021/0132147 A1* | 5/2021 | Chen | G01R 31/31725 |
| 2021/0165941 A1* | 6/2021 | Landman | G06F 30/3315 |
| 2021/0240905 A1* | 8/2021 | Guo | G06F 30/3308 |
| 2021/0326227 A1* | 10/2021 | Bhattacharya | G01R 31/31835 |
| 2021/0407614 A1* | 12/2021 | Patidar | G11C 29/12005 |
| 2022/0067250 A1* | 3/2022 | Chakrabarty | G06F 30/3312 |

OTHER PUBLICATIONS

S. Pandey, S. Gupta, M. S. L., S. Natarajan, A. Sinha and A. Chatterjee, "Characterization of Library Cells for Open-circuit Defect Exposure: A Systematic Methodology," 2019 IEEE International Test Conference (ITC), 2019, pp. 1-10, doi: 10.1109/ITC44170. 2019.9000154. (Year: 2019).*

F. Hapke, et al., "Cell-Aware Test." IEEE Trans. on CAD, vol. 33, No. 9, Sep. 2014, pp. 1396-1409.

A.D. Singh, "Cell Aware and Stuck-Open Tests." Proc. of European Test Symp., Jul. 2016.

R.E. Bryant, "A Switch-Level Model and Simulation for MOS Digital Systems." IEEE Trans. Computers, vol. C-33, No. 2, Feb. 1984, pp. 160-177.

M.T. Mostafavi, an L.G. Johnson, "Test Generation at the Transistor Level for MOS VLSI Combinational Logic Circuits." Proc. of Southeastcon, Apr. 1989, pp. 544-549.

[6] H.H. Chen, S. Y-H Chen, P.Y. Chuang, and C.W. Wu, "Efficient Cell-Aware Fault Modeling by Switch-Level Test Generation." Proc. of Asia Test Symp., Nov. 2016, pp. 197-202.

P.Y. Chuang, C.-W. Wu, and H.H. Chen, "Cell-Aware Test Generation Time Reduction by Using Switch-Level ATPG." Proc. of Intl. Test Conf. in Asia, Sep. 2017, pp. 27-32.

Y. Higami, et al., "Test Generation for Transistor Shorts using Stuck-at Fault Simulator and Test Generator." Proc. of Asian Test Sump., Oct. 2007, pp. 271-274.

K.Y. Chao, et al., "Gate Exhaustive Testing." in Proc. of Intl. Test Conf., Nov. 2005.

[10] N. Devtaprasanna, et al., "A Unified Method to Detect Transistor Stuck-Open Faults and Transition Delay Faults." Proc. of European Test Symp., May 2006, pp. 185-192.

N. Devtaprasanna, et al., "Test Generation for Open Defects in CMOS Circuits." Intl. Symp. on Defect and Fault Tolerance in VLSI System, Oct. 2006, pp. 41-49.

[12] X. Lin, et al., "On Improving Transition Test Set Quality to Detect CMOS Transistor Stuck-Open Faults." Proc. of Asian Test Symp., Nov. 2015.

X. Lin and S.M. Reddy, "On Generating High Quality Tests Based on Cell Functions." Proc. of Intl. Test Conf., Oct. 2015.

X. Lin and S.M. Reddy, "On Gate Function Based Test for Scan Designs." Proc. of VLSI-DAT, Apr. 2016.

C. Han and A.D. Singh, "Testing Cross-Wire Opens within Complex Gates." Proc. of VLSI Test Symp., Apr. 2015.

* cited by examiner

LIBRARY CELL WITH A CROSSING WIRE

LIBRARY CELL WITH A DIFFERENT DRIVE STRENGTHS

LIBRARY CELL WITH A FEEDBACK LOOP

LIBRARY CELL WITH A MULTIPLE NET SEGMENTS

LIBRARY CELL MODELING FOR TRANSISTOR-LEVEL TEST PATTERN GENERATION

TECHNICAL FIELD

This application is generally related to electronic design automation and, more specifically, to library cell modeling for transistor-level test pattern generation.

BACKGROUND

Automatic Test Pattern Generation (ATPG) is a process used to identify test patterns that, when applied to a digital circuit, enable Automatic Test Equipment (ATE) to distinguish between correct circuit behavior and faulty circuit behavior caused by manufacturing defects. Some ATPG processes, in attempt to reduce complexity, can utilize a gate-level netlist of a digital circuit to generate test patterns for the digital circuit. For example, these ATPG processes can identify fault sites at boundaries of metal-oxide-semiconductor (MOS) library cells of the digital circuit, generate models of the MOS library cells with their functionally-equivalent netlists at gate-level, and utilize the gate-level netlist and fault sites to generate the test patterns.

As the manufactural technologies move towards a fin field-effect transistor (FinFET) era, defects inside the MOS library cells can occur more often during manufacture, such as transistor open, transistor short, bridging, or the like. To quantify the behaviors of internal cell defects, some tools implementing ATPG processes include Cell-Aware Testing (CAT) to perform transistor-level analog simulation, such as Simulation Program with Integrated Circuit Emphasis (SPICE) simulation, to identify the cell input stimuli capable of detecting every defect injected in each MOS library cell. Since some complex MOS library cells have large number of internal fault sites for test pattern input, exhaustive transistor-level simulation is time-consuming and often impractical.

SUMMARY

This application discloses a computing system implementing an automatic test pattern generation tool to convert a transistor-level model of a library cell describing a digital circuit into a switch-level model of the library cell, generate test patterns configured to enable detection of target defects injected into the switch-level model of the library cell, and bifurcate the test patterns into a first subset of the test patterns and a second set of the test patterns based on detection types for the target defects enabled by the test patterns. The computing system can implement a cell model generation tool to perform an analog simulation of the transistor-level model of the library cell using the second subset of the test patterns to verify that they enable detection of target defects, while skipping performance of the analog simulation of the transistor-level model of the library cell using the first subset of the test patterns. Embodiments of will be described below in greater detail.

DETAILED DESCRIPTION

Illustrative Operating Environment

Figure 1:
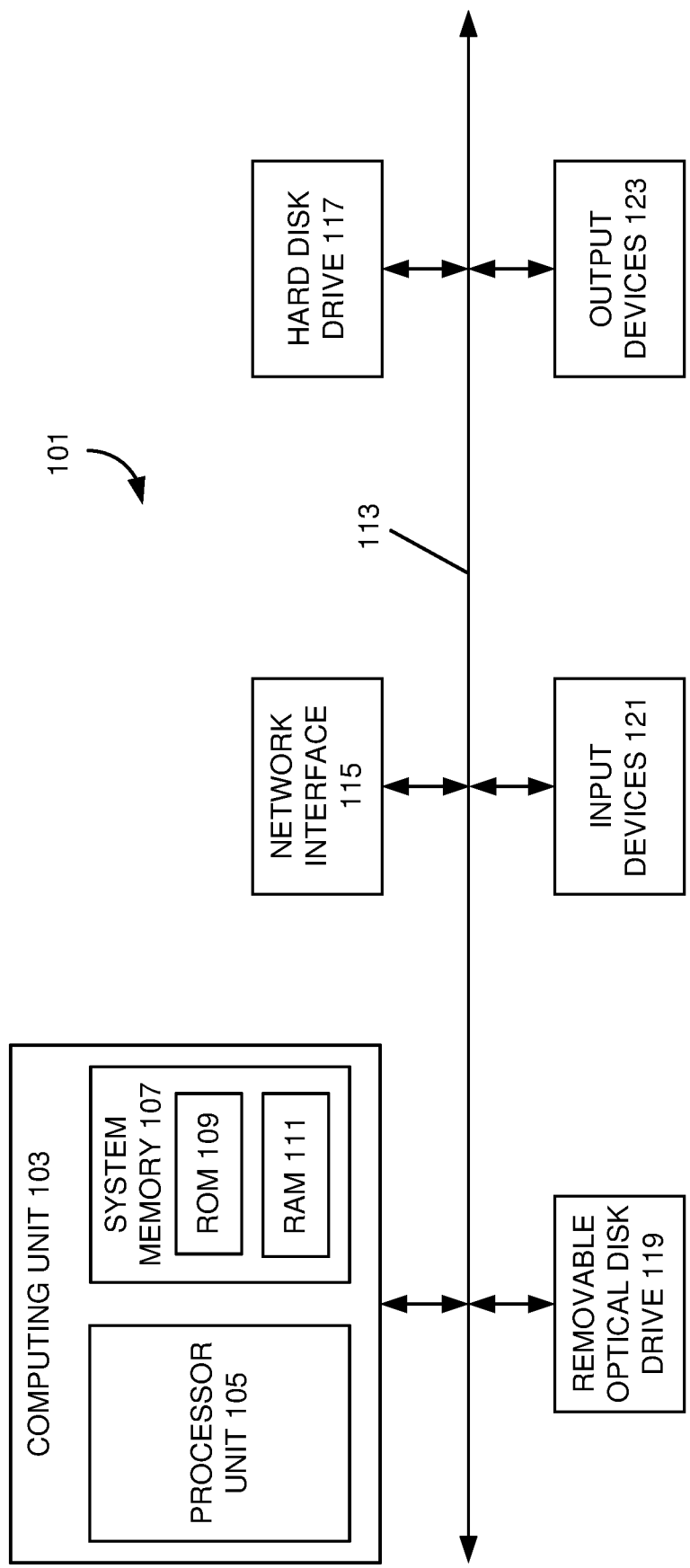
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processor unit 105 and a system memory 107. The processor unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processor unit 105.

The processor unit 105 and the system memory 107 are connected, either directly or indirectly, through a bus 113 or alternate communication structure, to one or more peripheral devices 115-123. For example, the processor unit 105 or the system memory 107 may be directly or indirectly connected to one or more additional memory storage devices, such as a hard disk drive 117, which can be magnetic and/or removable, a removable optical disk drive 119, and/or a flash memory card. The processor unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
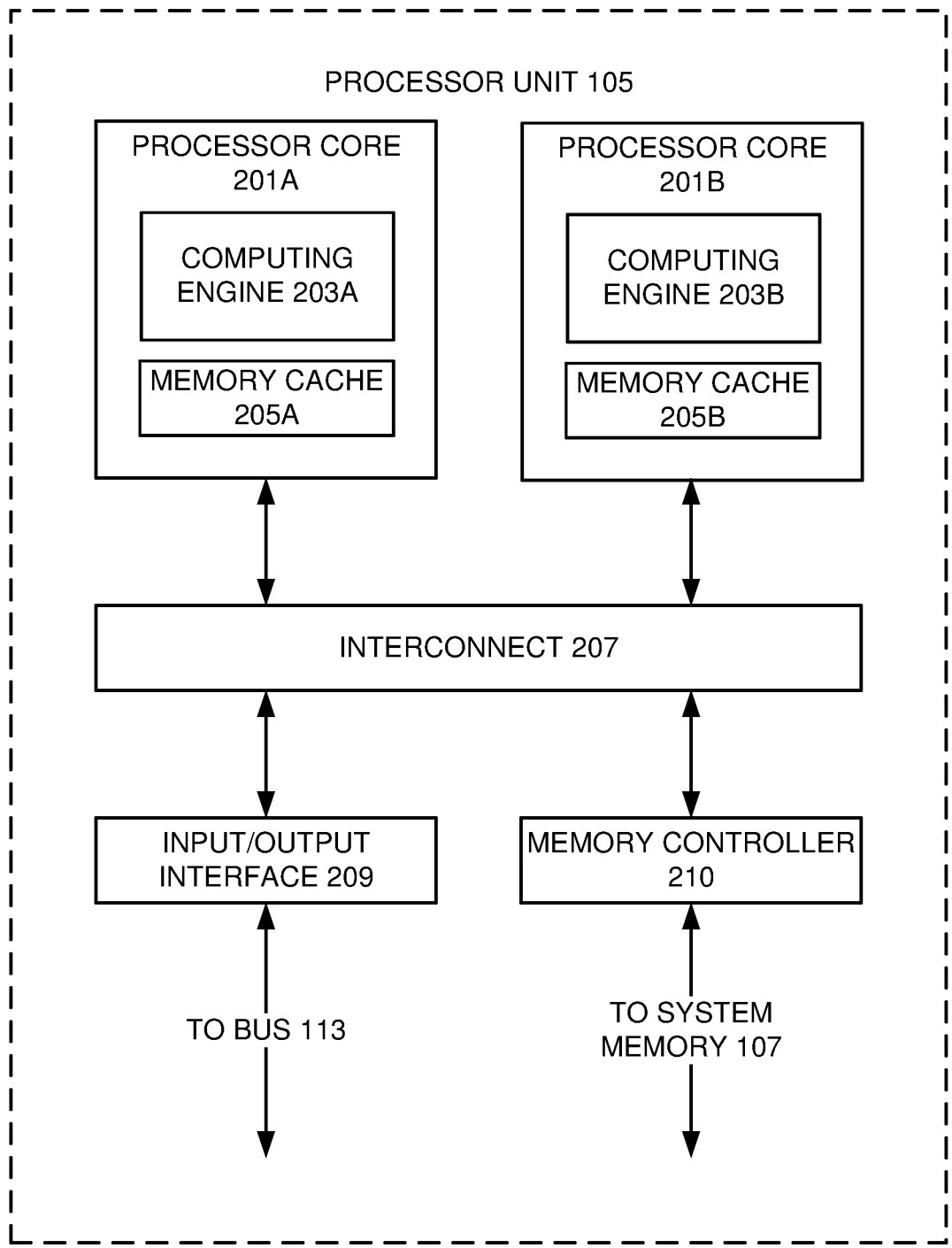

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and is not intended to suggest any limitation as to the scope of use or functionality of alternate embodiments.

Library Cell Modeling for Transistor-Level Test Pattern Generation

Figure 3:
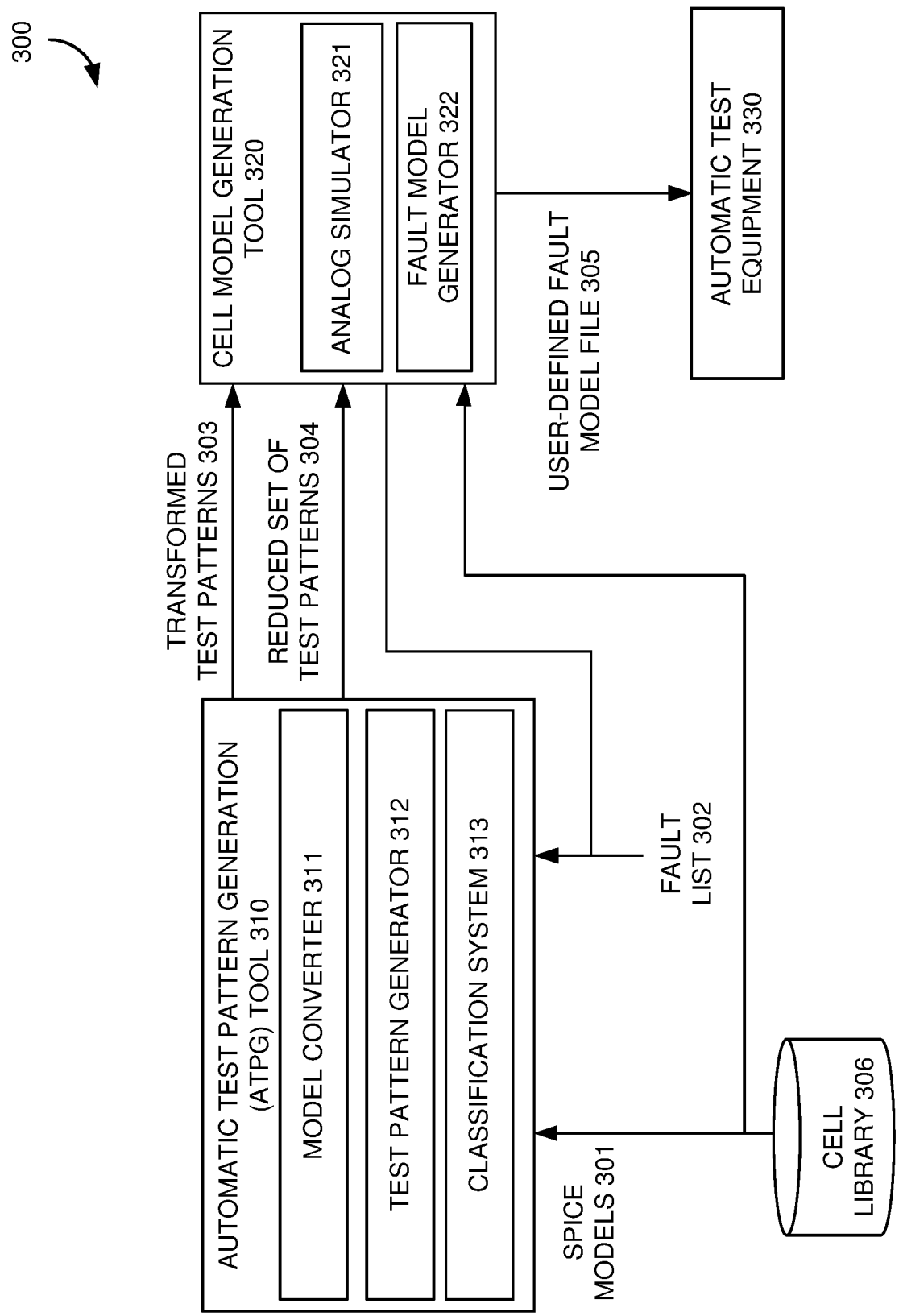
FIG. 3 illustrates an example system including automatic test pattern generation (ATPG) tool to generate a reduced set of test patterns for analog simulation by a cell model generation tool that may be implemented according to various embodiments.

FIG. 3 illustrates an example system 300 including automatic test pattern generation (ATPG) tool 310 to generate a reduced set of test patterns 304 for analog simulation by a cell model generation tool 320 that may be implemented according to various embodiments. Referring to FIG. 3, the automatic test pattern generation tool 310 can receive transistor-level models of library cells, such as Simulation Program with Integrated Circuit Emphasis (SPICE) models 301, from a cell library 306. The SPICE models 301 of the library cells can correspond to transistor-level netlists describing electronic circuits using metal-oxide-semiconductor (MOS) transistors, resistances, capacitors, inductances, or the like. The automatic test pattern generation tool 310 also can receive a fault list 302 describing types and locations of physical manufacturing defects to inject into the library cells. The fault list 302 can be generated by the cell model generation tool 320 and provided to the automatic test pattern generation tool 310 or, in some embodiments, generated by a tool external to the system 300 and provided to the automatic test pattern generation tool 310.

The automatic test pattern generation tool 310 can include a model converter 311 to generate switch-level models of the library cells from the SPICE models 301 of the library cells. The switch-level models of the library cells, sometimes called ATPG models, can correspond to gate-level netlists describing the electronic circuits, and have descriptions functionally equivalent to the SPICE models 301. In some embodiments, the model converter 311 can convert the SPICE models 301 into the switch-level models by retaining one or more of the transistors defined in the SPICE models 301, modifying resistances, capacitances, and inductances defined in the SPICE models 301 into wires, buffers, always-on transistors, or the like. The model converter 311 also can convert the SPICE models 301 into the switch-level models by inserting one or more primitive gates, such as AND gates, NAND gates, OR gates, NOR gates, BUFFER gates, INVERTOR gates, or the like, or transistor level primitives, such as n-type metal-oxide-semiconductor (NMOS) transistors, resistive n-type metal-oxide-semiconductor (RNMOS) transistors, p-type metal-oxide-semiconductor (PMOS) transistors, resistive p-type metal-oxide-semiconductor (RP-MOS) transistors, pull device, power/ground signals, or the like, into the switch-level models. Embodiments of the conversion of SPICE models into the switch-level models will be described below in greater detail.

Figure 4A:
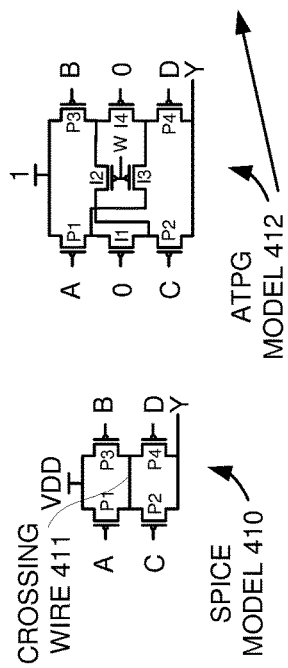
FIGS. 4A-4E illustrate example SPICE models and their corresponding automatic test pattern generation models according to various embodiments.

FIGS. 4A-4E illustrate example SPICE models and their corresponding automatic test pattern generation models according to various embodiments. Referring to FIG. 4A, a SPICE model 410 of a library cell with a crossing wire 411 is shown as including PMOS transistors P1-P4 receiving inputs A-D, respectively, at their gate terminal, and includes an output Y. The SPICE model 410 of the library cell can be converted into an ATPG model 412 by remodeling the crossing wire 411 in the SPICE model 410 using one or more dedicated gate primitives at the transistor level in the ATPG model 412. The dedicated gate primitives can allow an ATPG tool to inject defects at the dedicated gate primitives of the ATPG model 412 during test pattern generation. For example, the crossing wire 411 in the SPICE model 410 of the library cell can be remodeled from a bidirectional wire into a set of unidirectional transistors, such as PMOS transistors I1-I4, in the ATPG model 412. The PMOS transistors I2 and I3 can receive a dedicated signal line W at their respective gate terminals. Both dedicated signal line W and the gate terminals of I1 and I2 are tied to the constant signal 0 such that PMOS transistors P1-P4 behave as buffers in the faulty-free operation of the library cell.

A crossing wire open defect can be modeled in the ATPG model 412 by injecting a stuck-at-1 fault at the dedicated signal line W such that there is no signal flowing from PMOS transistors P1 and P4 and from PMOS transistors P3 and P2 in the faulty circuit. A resistant open defect can be modeled in the ATPG model 412 by injecting two transition faults at the drain terminal of PMOS transistors I2 and I3. If an ATPG tool can detect one of the injected transition fault using a test pattern then the test pattern can potentially detect the resistant open defect.

Figure 4B:
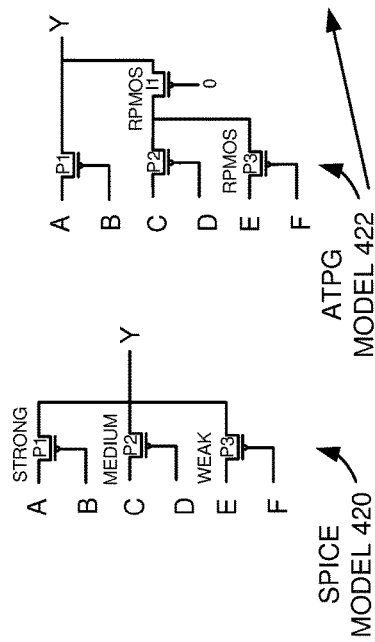

Referring to FIG. 4B, a SPICE model 420 of a library cell is shown as including PMOS transistors P1-P3 with differing drive strengths, such as a strong drive strength for PMOS transistor P1, a medium drive strength for PMOS transistor P2, and a weak drive strength for PMOS transistor P3. In this example, the PMOS transistor P1 can receive inputs A and B, the PMOS transistor P2 can receive inputs C and D, the PMOS transistor P3 can receive inputs E and F, and all three PMOS transistors can include an output Y. Since the outputs of the PMOS transistors P1-P3 connect together in the output Y, the value at the output Y can correspond to the value output from the stronger PMOS transistor turned-on. The SPICE model 420 of the library cell can be converted into an ATPG model 422 by remodeling the SPICE model 410 to replace the PMOS transistor P3 with a resistive PMOS (RPMOS) transistor in the ATPG model 412 and to add a RPMOS transistor in series with the PMOS transistor P2.

Figure 4C:
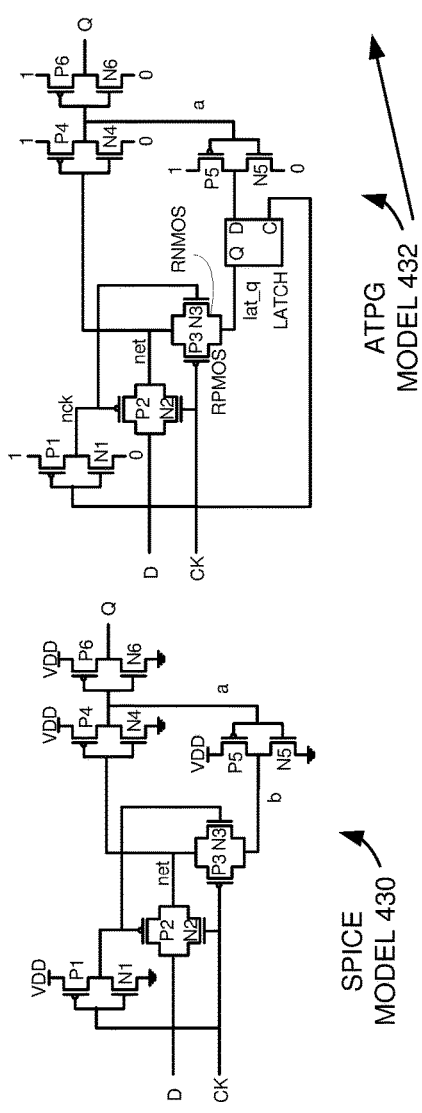

Referring to FIG. 4C, a SPICE model 430 of a library cell is shown as including a feedback loop, such as a signal path from an output of a transistor to an input of the transistor, for example, through a series of additional transistors, nets, or the like. In this example, the SPICE model 430 includes a feedback loop from a net to signal a to signal b and then back to the net. When an input CK to the SPCIE model 430 has a logic value of 1, the feedback loop can be blocked since a transmission gate implemented by the combination of PMOS transistor P3 and NMOS transistor N3 being turned off and a logic value from an input D can be propagated to a net to signal a to signal b and then to an output Q. When the input CK to the SPCIE model 430 has a logic value of 1, the feedback loop can become conductive, as the transmission gate implemented by the combination of PMOS transistor P2 and NMOS transistor N2 being turned off. The feedback loop can become stabilized at the previously captured value such that the output Q cab holds its value.

The SPICE model 430 of the library cell can be converted into an ATPG model 432 by remodeling the SPICE model 430 with an insertion of a latch driven by signals b and CK. The latch can capture the signal b when the input CK has logic value 1 and store the value when the input CK changes logic value of 0, such that the output Q can hold previously captured value. In some examples, the transmission gate implemented by the combination of PMOS transistor P2 and NMOS transistor N2 can have a stronger driving strength than the transmission gate implemented by the combination of PMOS transistor P3 and NMOS transistor N3, for the ATPG model 432 can replace the PMOS transistor P3 and the NMOS transistor N3 with a RPMOS transistor and a RNMOS transistor, respectively.

Figure 4D:
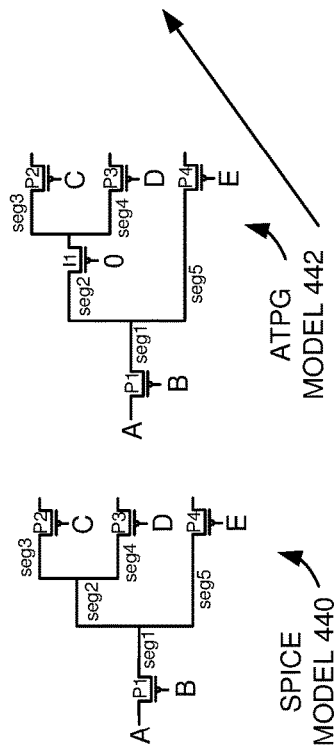

Referring to FIG. 4D, a SPICE model 440 of a library cell is shown as including multiple net segments, such as an output of a PMOS transistor P1 may drive multiple other PMOS transistors P2-P4 through a net having multiple segments seg 1-seg 5. The SPICE model 440 of the library cell can be converted into an ATPG model 442 by remodeling the SPICE model 440 using a net-based analysis. For example, an ATPG tool can identify when nets in the SPICE model 440 include multiple segments and selectively insert dedicated transistors, such as a PMOS transistor, into segments based on segment type.

Figure 4E:
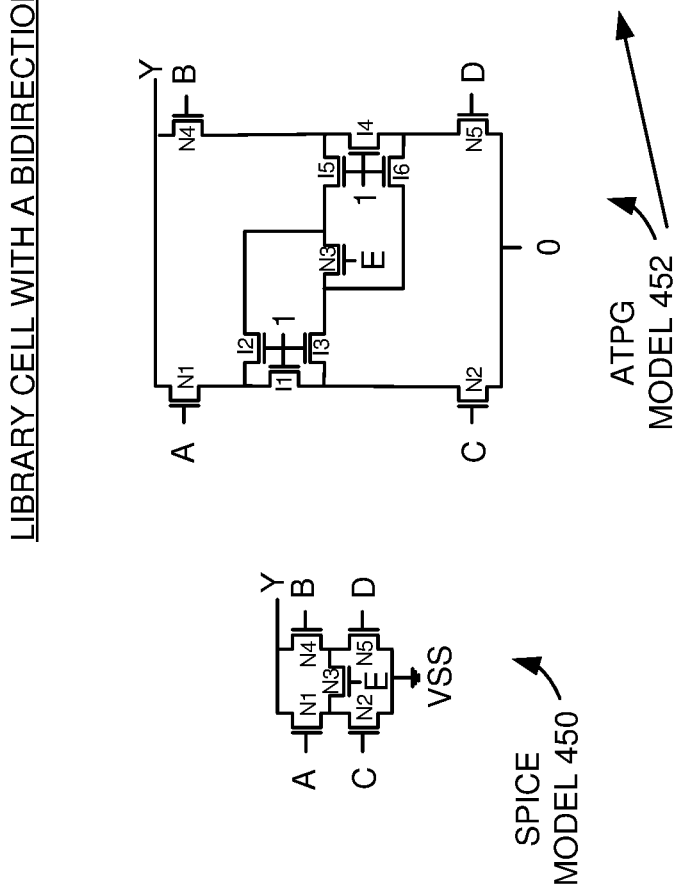

Referring to FIG. 4E, a SPICE model 450 of a library cell is shown as including bidirectional transistor N3. PMOS transistors and NMOS transistors typically have a unidirectional signal flow, i.e., from a source terminal to a drain terminal. In the instant example, however, the SPICE model 450 includes a bidirectional transistor N3 capable of signal flows in both directions. The SPICE model 450 of the library cell can be converted into an ATPG model 452 by remodeling the SPICE model 450 to replace the bidirectional transistor N3 with a unidirectional transistor N3 and include a set of unidirectional transistors, such as NMOS transistor I1-I6.

Referring back to FIG. 3, the model converter 311 also can generate fault models, which can model defects internal to the library cells described in the SPICE models 301, such as a transistor stuck-off defect, a transistor stuck-on defect, a transistor resistive open defect, a net segment complete open defect, a via complete open defect, a via resistive open defect, a bridge between nets or transistor terminals defect, or the like. For example, the fault models can model the transistor stuck-off defect with a stuck-at-1 fault at the gate terminal of the PMOS transistor or a stuck-at-0 fault at the gate terminal of the NMOS transistor. The fault models can model the transistor stuck-on defect with a stuck-at-0 fault at the gate terminal of the PMOS transistor or a stuck-at-1 fault at the gate terminal of the NMOS transistor. The fault models can model the transistor resistive open defect at a source terminal or a sink terminal of a transistor, which can be activated by input transitions 1-to-0, 0-to-1, high impedance-to-0, high impedance-to-1, 0-to-high impedance, 1-to-high impedance. The fault models can model the net segment complete open defect similarly to the transistor stuck-off defect when the net segment is mapped to a stem in the library cell, or similarly to the transistor stuck-on defect when the net segment is mapped to a branch in the library cell. The fault models can model the via complete open defect similarly to a net segment complete open defect when the net segment includes the via. The fault models can model the via resistive open defect similarly to the net segment resistive open defect when the net segment includes the via. The fault models can model the bridge between nets or transistor terminals defect using an aggressor-victim fault model having faults associated with each net as the aggressor.

The automatic test pattern generation tool 310 can include a test pattern generator 312 to identify test patterns that, when applied to an electronic circuit, enable Automatic Test Equipment (ATE) 330 to distinguish between correct circuit behavior and faulty circuit behavior caused by manufacturing defects. The test pattern generator 312 can utilize the fault list 302 to inject defects at particular locations in the switch-level models of the library cells and then identify test patterns prompting the switch-level models of the library cells to generate output capable of annunciating the presence of the injected defects. In some embodiments, the test pattern generator 312 can simulate the switch-level models of the library cells with various test patterns and determine whether each test pattern can be utilized to detect the injected defect. All of the test patterns that the test pattern generator 312 utilized to generate output indicative of an injected defect in the switch-level models of the library cells can correspond to the test patterns generated by the test pattern generator 312.

Some common physical defects occurring inside of library cells—open circuit and short circuit defects—can be injected into the switch-level models of the library cells by the test pattern generator 312 through the use of the fault models. In some embodiments, the fault models can simplify defect behaviors in order to reduce the computation complexity while the test pattern generator 312 identifies the test patterns. The test pattern generator 312 can utilize the fault list 302 to generate the fault model, for example, modeling open circuit defects as a transistor with a stuck-off condition, a resistive open, or the like, while modeling short circuit defects as a transistor with a stuck-on condition, bridging between nets or transistor terminals, or the like.

The test pattern generator 312, in some embodiments, can generate a mapping that explicitly correlates defects to fault sites targeted for injection using the fault model. For example, the test pattern generator 312 can detect a transistor stuck-off defect for a PMOS transistor utilizing a two-cycle test pattern, i.e., a first cycle having a high gate voltage that discharges an output in both faulty-free and faulty library cell and a second cycle having a low gate voltage to charge the output only in the faulty-free cell. As a result, the test pattern generator 312 can generate a mapping that correlated a transistor stuck-off defect to a stuck-at-0 condition at the output of the transistor. The test pattern generator 312 can utilize the mapping to apply the fault models to fault sites and generate test patterns capable of allowing detection of defects.

The automatic test pattern generation tool 310 can include a classification system 313 to analyze the test patterns generated by the test pattern generator 312 and identify a type of defect detection enabled by the test patterns. For example, some test patterns can prompt the switch-level model to generate output that annunciates a presence of defects regardless of test application conditions. The classification system 313 can categorize or classify these of test patterns as a hard-detection type of test pattern. The classification system 313 can categorize or classify other test patterns, such as those that prompt the switch-level model to generate output that conditionally annunciates a presence of defects, as a soft-detection type of test pattern.

Since the test patterns classified as the hard-detection type can be utilized to annunciate the defect regardless of the test application conditions, the classification system 313 can elect to skip further verifying those test patterns with an analog simulation. The classification system 313 can transform the test patterns classified as a hard-detection type into a format usable by the automatic test equipment 330 to detect manufacturing defects in electronic circuits, such as a user-defined fault model (UDFM) file format. The classification system 313 can output the transformed test patterns 303 to the cell model generation tool 320.

The classification system 313 can determine to further verify the test patterns classified as the soft-detection type through an analog simulation. The classification system 313 can output the test patterns classified as the soft-detection type to the cell model generation tool 320, for example, as the reduced set of test patterns 304. Rather than providing all of the test patterns generated by the test pattern generator 312 to the cell model generation tool 320 for analog simulation, which can be time-consuming and often impractical, the ATPG tool 310 reduced the number of the test patterns provided to the cell model generation tool 320 for analog simulation based, at least in part, on the type of defect detection enabled by the test patterns.

The cell model generation tool 320 can receive the transformed test patterns 303, for example, corresponding to generated test patterns classified as hard-detection types, and receive the reduced set of test patterns 304 to verify utilizing analog simulation. The cell model generation tool 320 also can receive the SPICE models 301 from the cell library 306.

The cell model generation tool 320 can include an analog simulator 321 to simulate the SPICE models 301 and inject the simulated SPICE models with defects described in the fault list 302. The analog simulator 321 can provide the reduced set of test patterns 304 from the ATPG tool 310 to the simulated SPICE models 301 injected with defects and record the output results.

The cell model generation tool 320 can include a fault model generator 322 to analyze the output results from the analog simulation of the SPICE models 301 to verify whether the reduced set of test patterns 304 can be utilized to detect the injected defects. When the fault model generator 322 cannot verify a test pattern of the reduced set of test patterns 304, the fault model generator 322 can exclude that test pattern from a fault model for the corresponding library cell. Conversely, when the fault model generator 322 verifies a test pattern of the reduced set of test patterns 304, the fault model generator 322 can convert that test pattern into a format usable by the automatic test equipment 330 to detect manufacturing defects in electronic circuits, such as a user-defined fault model (UDFM) file format. The fault model generator 322 can generate a user-defined fault model (UDFM) file 305 by aggregating the transformed test patterns 303 with the test patterns having been converted by the fault model generator 322 in response to the analog simulation. In some embodiments, the user-defined fault model file 305 can be provided directly to the automatic test equipment 330 or provided to the automatic test pattern generation tool 310 for subsequent use when generating test patterns on a full-chip design that includes the library cells corresponding to the SPICE models 301.

Figure 5:
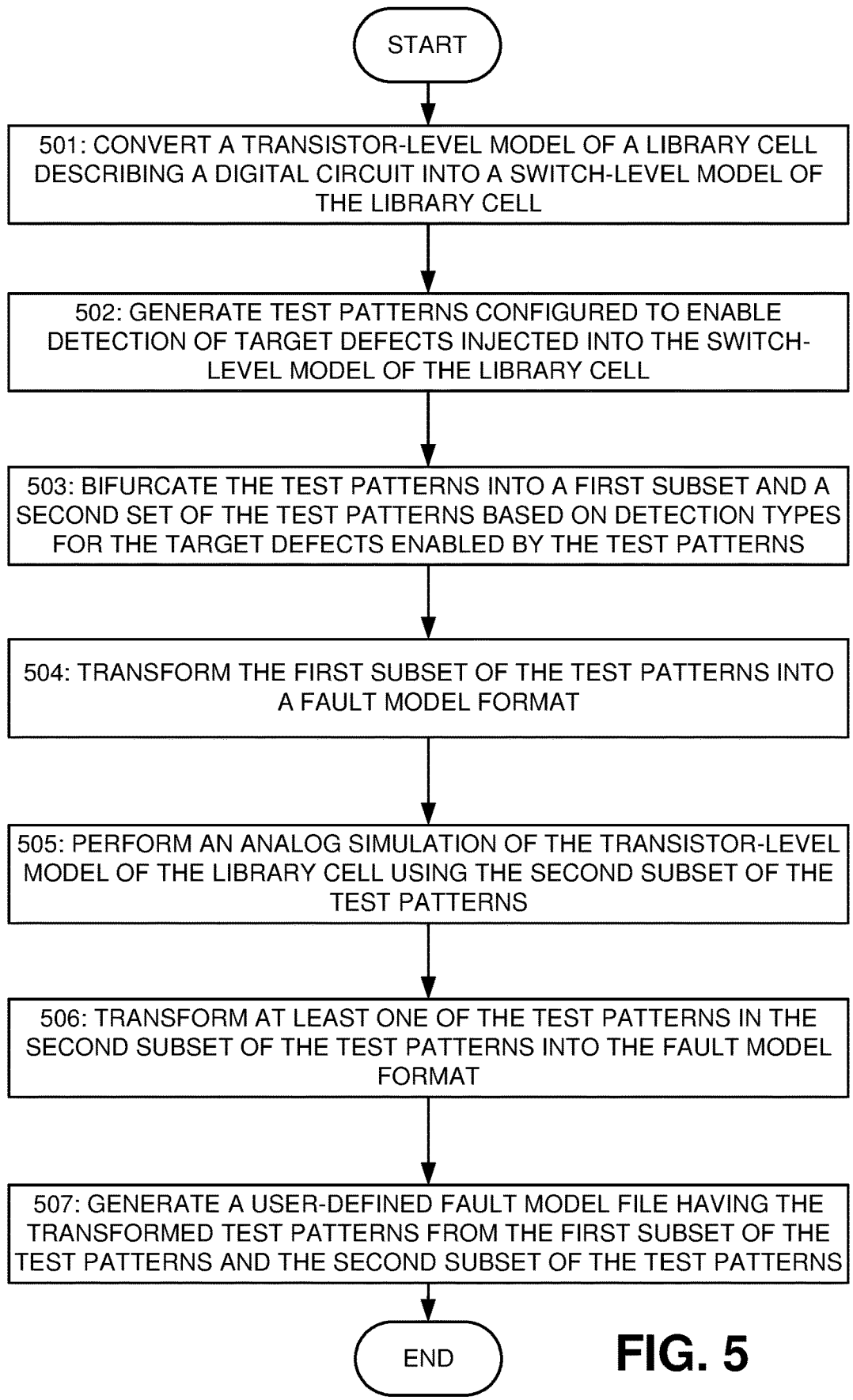
FIG. 5 illustrates a flowchart showing an example implementation of selective verification of test patterns using analog simulation according to various examples.

FIG. 5 illustrates a flowchart showing an example implementation of selective verification of test patterns using analog simulation according to various examples. Referring to FIG. 5, in a block 501, a computing system implementing an Automatic Test Pattern Generation (ATPG) tool can convert a transistor-level model of a library cell describing a digital circuit into a switch-level model of the library cell. In some embodiments, transistor-level model of the library cell, sometimes called a SPICE model, can correspond to a transistor-level netlist describing an electronic circuit using metal-oxide-semiconductor (MOS) transistors, resistances, capacitors, inductances, or the like. The switch-level model of the library cell, sometimes called an ATPG model, can correspond to a gate-level netlist describing the electronic circuit, for example, describing the electronic circuit as a list of gate-level components and describing the corresponding connectivity between those components, and have a description functionally equivalent to the transistor-level model of the library cell.

In some embodiments, the ATPG tool can convert the transistor-level model into the switch-level model by retaining one or more of the transistors defined in the transistor-level model, modifying resistances, capacitances, and inductances defined in the transistor-level model into wires, buffers, always-on transistors, or the like. The ATPG tool also can convert the transistor-level model into the switch-level model by inserting one or more primitive gates, such as AND gates, NAND gates, OR gates, NOR gates, BUFFER gates, INVERTOR gates, or the like, or transistor level primitives, such as n-type metal-oxide-semiconductor (NMOS) transistors, resistive n-type metal-oxide-semiconductor (RNMOS) transistors, p-type metal-oxide-semiconductor (PMOS) transistors, resistive p-type metal-oxide-semiconductor (RPMOS) transistors, pull device, power/ground signals, or the like, into the switch-level model.

In a block 502, the computing system implementing the ATPG tool can generate test patterns configured to enable detection of target defects injected into the switch-level model of the library cell. The ATPG tool can identify test patterns that, when applied to an electronic circuit, enable automatic test equipment to distinguish between correct circuit behavior and faulty circuit behavior caused by manufacturing defects. The ATPG tool can inject defects at particular locations in the switch-level model and then identify test patterns prompting the switch-level model to generate output capable of annunciating the presence of the injected defects. The ATPG tool, in some embodiments, can generate an exhaustive set of test patterns for each of the defects. In some embodiments, the ATPG tool can simulate the switch-level model with the exhaustive set of the test patterns and determine whether each test pattern can be utilized to detect the injected defect. All of the test patterns that the ATPG tool utilized to generate output indicative of an injected defect in the switch-level model can correspond to the test patterns generated by the ATPG tool.

In a block 503, the computing system implementing the ATPG tool can bifurcate the test patterns into a first subset of the test patterns and a second set of the test patterns based on detection types for the target defects enabled by the test patterns. The ATPG tool can identify a type of defect detection enabled by the test patterns. For example, some test patterns can prompt the switch-level model to generate output that annunciates a presence of defects regardless of test application conditions. The ATPG tool can categorize or classify these of test patterns as a hard-detection type of test pattern and associate them with the first subset of the test patterns. The ATPG tool can categorize or classify other test patterns, such as those that prompt the switch-level model to generate output that conditionally annunciates a presence of defects, as a soft-detection type of test pattern and associate them with the second subset of the test patterns.

In a block 504, the computing system implementing the ATPG tool can transform the first subset of the test patterns into a fault model format, for example, usable by the automatic test equipment to detect manufacturing defects in electronic circuits, such as a user-defined fault model (UDFM) file format. Since the first subset of the test patterns has been classified as the hard-detection type can be utilized to annunciate the defect regardless of the test application conditions, the ATPG tool can elect to skip further verifying those test patterns with an analog simulation.

In a block 505, the computing system implementing a cell model generation tool can perform an analog simulation of the transistor-level model of the library cell using the second subset of the test patterns. The cell model generation tool can inject the simulated transistor-level model with defects, input the second subset of the test patterns to the simulated transistor-level model injected with defects, and record the output results. The cell model generation tool can analyze the output results from the analog simulation to verify whether the second subset of the test patterns can be utilized to detect the injected defects.

In a block 506, the computing system implementing the cell model generation tool can transform at least one of the test patterns in the second subset of the test patterns into the fault model format. When the cell model generation tool verifies a test pattern of the second subset of the test patterns can be utilized to detect the injected defects, the cell model generation tool can convert that test pattern into a fault model format. When the cell model generation tool cannot verify a test pattern of the second subset of the test patterns can be utilized to detect the injected defects, the cell model generation tool can exclude that test pattern from a fault model file for the corresponding library cell.

In a block 507, the computing system implementing the cell model generation tool can generate a user-defined fault model file having the transformed test patterns in the fault model format from the first subset of the test patterns and the second subset of the test patterns. In some embodiments, the cell model generation tool can aggregate the transformed test patterns into the user-defined fault model file for use by the automatic test equipment to detect manufacturing defects in electronic circuits The cell model generation tool also can perform other operations on the transformed test patterns during the creation of the user-defined fault model file, for example, minimizing or otherwise simplifying the transformed test patterns and then creating the user-defined fault model file based on the minimized or simplified test patterns.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to design processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
converting, by a computing system, a transistor-level model of a library cell describing a digital circuit into a switch-level model of the library cell;
generating, by the computing system, test patterns configured to enable detection of target defects injected into the switch-level model of the library cell;
dividing, by the computing system, the test patterns into a first subset of the test patterns and a second set of the test patterns based on detection types for the target defects enabled by the test patterns;
performing, by the computing system, an analog simulation of the transistor-level model of the library cell using the second subset of the test patterns to determine which of the test patterns in the second subset of the test patterns enables detection of the target defects when injected into the transistor-level model of the library cell; and
determining, by the computing system, to skip performance of the analog simulation of the transistor-level model of the library cell using the first subset of the test patterns.

2. The method of claim 1, further comprising classifying, by the computing system, the test patterns based on a type of defect detection that is enabled by the test patterns, wherein dividing the test patterns is performed based on the classification.

3. The method of claim 1, further comprising transforming, by the computing system, the first subset of the test patterns into a fault model format.

4. The method of claim 3, further comprising:
transforming, by the computing system, the test patterns in the second subset of the test patterns, which were determined to enable detection of the target defects when injected into the transistor-level model of the library cell, into the fault model format; and
combining, by the computing system, the transformed test patterns in the fault model format from the first subset of the test patterns and the second subset of the test patterns into a user-defined fault model file.

5. The method of claim 4, wherein the user-defined fault model file is configured to allow automatic test equipment to generate test patterns for detection of manufacturing defects in the digital circuit.

6. The method of claim 1, wherein the transistor-level model of the library cell corresponds to a Simulation Program with Integrated Circuit Emphasis (SPICE) model of the library cell, and wherein the switch-level model of the library cell corresponds to an Automatic Test Pattern Generation (ATPG) model of the library cell.

7. A system comprising:
a memory system configured to store computer-executable instructions; and
a computing system, in response to execution of the computer-executable instructions, is configured to:
convert a transistor-level model of a library cell describing a digital circuit into a switch-level model of the library cell;
generate test patterns configured to enable detection of target defects injected into the switch-level model of the library cell;
divide the test patterns into a first subset of the test patterns and a second set of the test patterns based on detection types for the target defects enabled by the test patterns;
perform an analog simulation of the transistor-level model of the library cell using the second subset of the test patterns to determine which of the test patterns in the second subset of the test patterns enables detection of the target defects when injected into the transistor-level model of the library cell; and
determine to skip performance of the analog simulation of the transistor-level model of the library cell using the first subset of the test patterns.

8. The system of claim 7, wherein the computing system, in response to execution of the computer-executable instructions, is further configured to:
classify the test patterns based on a type of defect detection that is enabled by the test patterns; and
divide the test patterns based on the classification.

9. The system of claim 7, wherein the computing system, in response to execution of the computer-executable instructions, is further configured to transform the first subset of the test patterns into a fault model format.

10. The system of claim 9, wherein the computing system, in response to execution of the computer-executable instructions, is further configured to:
transform one or more of the test patterns in the second subset of the test patterns, which were determined to enable detection of the target defects when injected into the transistor-level model of the library cell, into the fault model format; and
combine the transformed test patterns in the fault model format from the first subset of the test patterns and the second subset of the test patterns into a user-defined fault model file.

11. The system of claim 10, wherein the user-defined fault model file is configured to allow automatic test equipment to generate test patterns for detection of manufacturing defects in the digital circuit.

12. An apparatus comprising at least one computer-readable memory device storing instructions configured to cause one or more processing devices to perform operations comprising:
- converting a transistor-level model of a library cell describing a digital circuit into a switch-level model of the library cell;
- generating test patterns configured to enable detection of target defects injected into the switch-level model of the library cell;
- dividing the test patterns into a first subset of the test patterns and a second set of the test patterns based on detection types for the target defects enabled by the test patterns;
- performing an analog simulation of the transistor-level model of the library cell using the second subset of the test patterns to determine which of the test patterns in the second subset of the test patterns enables detection of the target defects when injected into the transistor-level model of the library cell; and
- determining to skip performance of the analog simulation of the transistor-level model of the library cell using the first subset of the test patterns.

13. The apparatus of claim 12, wherein the instructions are configured to cause one or more processing devices to perform operations further comprising classifying the test patterns based on a type of defect detection that is enabled by the test patterns, wherein dividing the test patterns is performed based on the classification.

14. The apparatus of claim 12, wherein the instructions are configured to cause one or more processing devices to perform operations further comprising transforming the first subset of the test patterns into a fault model format.

15. The apparatus of claim 14, wherein the instructions are configured to cause one or more processing devices to perform operations further comprising:
- transforming one or more of the test patterns in the second subset of the test patterns, which were determined to enable detection of the target defects when injected into the transistor-level model of the library cell, into the fault model format; and
- combining the transformed test patterns in the fault model format from the first subset of the test patterns and the second subset of the test patterns into a user-defined fault model file.

16. The apparatus of claim 15, wherein the user-defined fault model file is configured to allow automatic test equipment to generate test patterns for detection of manufacturing defects in the digital circuit.

17. The apparatus of claim 12, wherein the transistor-level model of the library cell corresponds to a Simulation Program with Integrated Circuit Emphasis (SPICE) model of the library cell, and wherein the switch-level model of the library cell corresponds to an Automatic Test Pattern Generation (ATPG) model of the library cell.

* * * * *